United States Patent [19]
Kawashima

[11] Patent Number: 5,311,096
[45] Date of Patent: May 10, 1994

[54] KT CUT WIDTH-EXTENSIONAL MODE QUARTZ CRYSTAL RESONATOR

[75] Inventor: Hirofumi Kawashima, Sendai, Japan

[73] Assignee: Seiko Electronic Components Ltd., Japan

[21] Appl. No.: 822,532

[22] Filed: Jan. 17, 1992

[30] Foreign Application Priority Data

| Jan. 25, 1991 | [JP] | Japan | 3-007854 |
| Aug. 6, 1991 | [JP] | Japan | 3-196864 |
| Aug. 29, 1991 | [JP] | Japan | 3-219025 |
| Sep. 2, 1991 | [JP] | Japan | 3-221725 |
| Sep. 27, 1991 | [JP] | Japan | 3-249840 |
| Nov. 8, 1991 | [JP] | Japan | 3-293424 |

[51] Int. Cl.$^5$ .................................. H01L 41/08
[52] U.S. Cl. .................. 310/361; 310/367; 310/368
[58] Field of Search .................. 310/361, 367, 368

[56] References Cited

U.S. PATENT DOCUMENTS

| 3,375,379 | 3/1968 | Royer | 310/361 |
| 3,699,484 | 10/1972 | Berlincourt | 310/320 |
| 4,126,802 | 11/1978 | Herman | 310/361 |
| 4,148,530 | 4/1979 | Calderara | 310/361 |
| 4,167,686 | 9/1979 | Fukuyo | 310/361 |
| 4,245,173 | 1/1981 | Zumsteg et al. | 310/361 |
| 4,350,918 | 9/1982 | Sato | 310/367 |
| 4,633,124 | 12/1986 | Kawashima | 310/361 |
| 4,900,971 | 2/1990 | Kawashima | 310/361 |
| 4,924,132 | 5/1990 | Ziegler | 310/361 |
| 4,926,086 | 5/1990 | Bourgeois et al. | 310/361 |

FOREIGN PATENT DOCUMENTS

| 0277272 | 8/1988 | European Pat. Off. . |
| 0350443 | 1/1990 | European Pat. Off. . |
| 0040295 | 4/1978 | Japan | 310/361 |
| 0037492 | 3/1979 | Japan | 310/361 |
| 0052621 | 4/1980 | Japan | 310/368 |
| 0218019 | 12/1984 | Japan | 310/367 |
| 0128706 | 7/1985 | Japan | 310/367 |
| 2020898 | 11/1979 | United Kingdom . |
| 2224159 | 4/1990 | United Kingdom . |

OTHER PUBLICATIONS

Nachrichten Elektronik, vol. 34, No. 6, Jun. 1980, Heidelberg pp. 201-202, T. Frensch "Schwingquarze mit zweimal gedrehter Schnittebene verbessen die Frequenzstabilitat von Ostillatoren".

Patent Abstracts of Japan, vol. 6, No. 147 (E-123) (1025) Aug. 6, 1982.

*Primary Examiner*—Steven L. Stephan
*Assistant Examiner*—C. LaBalle
*Attorney, Agent, or Firm*—Bruce L. Adams; Van C. Wilks

[57] ABSTRACT

A width-extensional mode quartz crystal resonator formed by etching from a quartz crystal plate which is cut along a plane defined in the O-xyz coordinate system of the quartz crystal lattice by rotating the original Z plane around the x axis by a rotation angle in the range of 23°-28°. The quartz crystal resonator has a thickness-to-width ratio $R_{zx}$ in the range of 0.45-0.65. A pair of exciting electrodes are disposed on the resonator along opposed side faces perpendicular to the widthwise direction. The width-extensional mode quartz crystal resonator may be etched from a quartz crystal plate to provide a small sized resonator. A width-extensional mode vibrational portion is supported at its lengthwise sides by a pair of first bridge portions extending from a first frame portion. A pair of second bridge portions extend from a second frame portion and support the first frame at central portions of its lengthwise sides.

12 Claims, 7 Drawing Sheets

KT CUT WIDTH-EXTENSIONAL MODE QUARTZ CRYSTAL RESONATOR

BACKGROUND OF THE INVENTION

The present invention relates to a width-extensional mode quartz crystal resonator having specific features of a KT cut angle, thickness-to-width ratio, configuration and excitation electrode structure. Particularly, the invention relates to the width-extensional mode quartz crystal of the type most suitable for use in a reference signal source of pagers, IC cards, and vehicle telecommunication, in which is required a resonator having a compact size, high accuracy, shock resistance and low cost.

Conventionally, a thickness shear mode quartz crystal resonator is used in a frequency range over 4 MHz. The oscillating frequency of this type of resonator is determined substantially by its thickness. Particularly, there is preferably used an AT cut type of the resonator which features a good frequency temperature behavior. This type of the resonator is produced by mechanical machining. However, the conventional AT cut quartz crystal resonator is difficult to mount when its size is reduced since it is formed by mechanical working, thereby causing an increase in a series resistance $R_1$ and causing generation of a spurious response. Thus, miniaturization of the resonator is limited. Further, this type of the resonator has various drawbacks such as poor shock resistance and limitation in cost reduction because of the individual machining of the resonator element, when used as a very small size oscillating source in various portable instruments. Thus, there has been long desired a quartz crystal resonator having a new cut angle and new shape which features an oscillating frequency over 4 MHz, very small size, reduced series resistance $R_1$, zero temperature coefficient and applicability of being formed by an etching process.

SUMMARY OF THE INVENTION

An object of the invention is to provide a new cut of the width-extensional mode quartz crystal resonator.

Another object of the invention is to determine an optimum thickness-to-width ratio effective to improve frequency-temperature characteristics of the width-extensional mode quartz crystal resonator.

A further object of the invention is to provide an excitation electrode structure effective to reduce a series resistance $R_1$ of the resonator.

A still further object of the invention is to provide the width-extensional mode quartz crystal resonator having a small shape effective to reduce dissipation of the oscillating energy of the resonator.

According to one aspect of the present invention, a new cut angle is contemplated in the width-extensional mode quartz crystal resonator in order to achieve excellent frequency-temperature characteristics. Namely, in order to determine a cut angle of the width-extensional mode quartz crystal resonator which undergoes expanding and contracting oscillation in the width direction, there is defined a Z plane which is perpendicular to the z axis of the quartz crystal lattice structure. Then, the Z plane is rotated around the x axis in the counterclockwise direction by an angle $\phi$ set in the range of 20°–35° to define a new plane. A quartz crystal plate is cut along this new plane to produce the width-extensional quartz crystal resonator which can perform a desired frequency temperature behavior within the set range of the cut angle $\phi$.

According to another aspect of the present invention, the thickness-to-width ratio of the resonator is suitably set to obtain a desired first order temperature coefficient.

According to a further aspect of the present invention, the excitation electrode of the resonator is suitably arranged to facilitate oscillation of the width-extensional mode quartz crystal resonator which undergoes significant vibration in the widthwise direction, thereby reducing the series resistance.

DETAILED DESCRIPTION OF PREFERRED EMBODIMENTS

Figure 1:
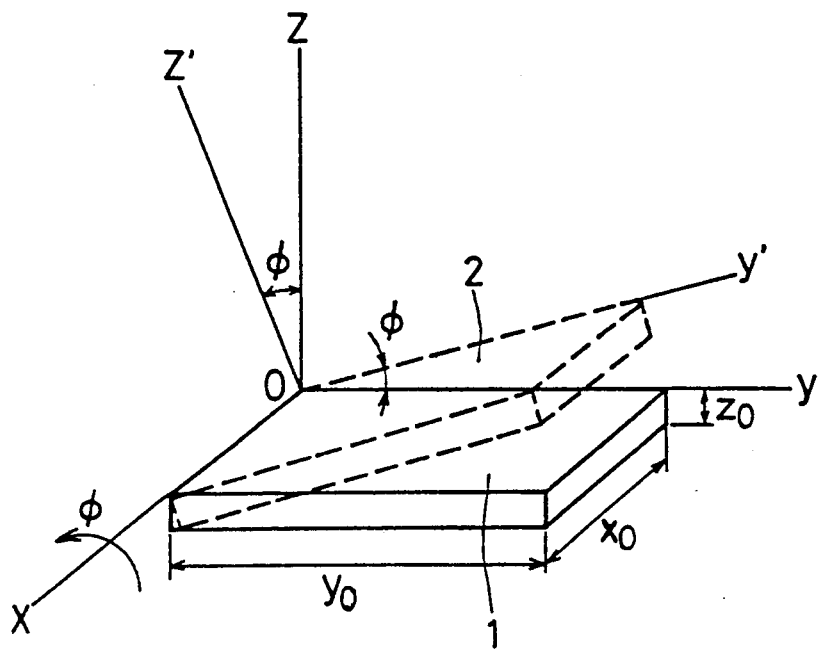
FIG. 1 shows the inventive width-extensional mode quartz crystal resonator and its coordinate system.

FIG. 1 shows a width-extensional mode quartz crystal resonator 1 and its coordinate system. The coordinate system is comprised of an origin point 0, an electrical axis x, a mechanical axis y and an optical axis z to thereby constitute the system O-xyz. The resonator 1 has a width $x_0$, a thickness $z_0$ and a length $y_0$, and is constructed to undergo expanding and contracting vibration in the widthwise direction. The resonator 1 is cut from the Z plate which is perpendicular to the z axis. On the other hand, a practical and actual resonator 2 indicated by the dashed line is cut from another Z plate which is defined by rotating the original Z plate around the x axis in the counterclockwise direction by a cut angle $\phi$ set in the range 20°–35°. Hereinafter, this cut mode is referred to as "KT cut". The rotated coordinate system is indicated by O-x'y'z'. The temperature coefficients of the quartz elastic stiffness and the thermal expansion coefficients are varied dependently on the cut angle $\phi$. A desired frequency temperature behavior can be obtained by selecting suitably the cut angle. Hereinafter, the frequency temperature behavior will be described in detail in terms of the cut angle $\phi$.

Figure 2:
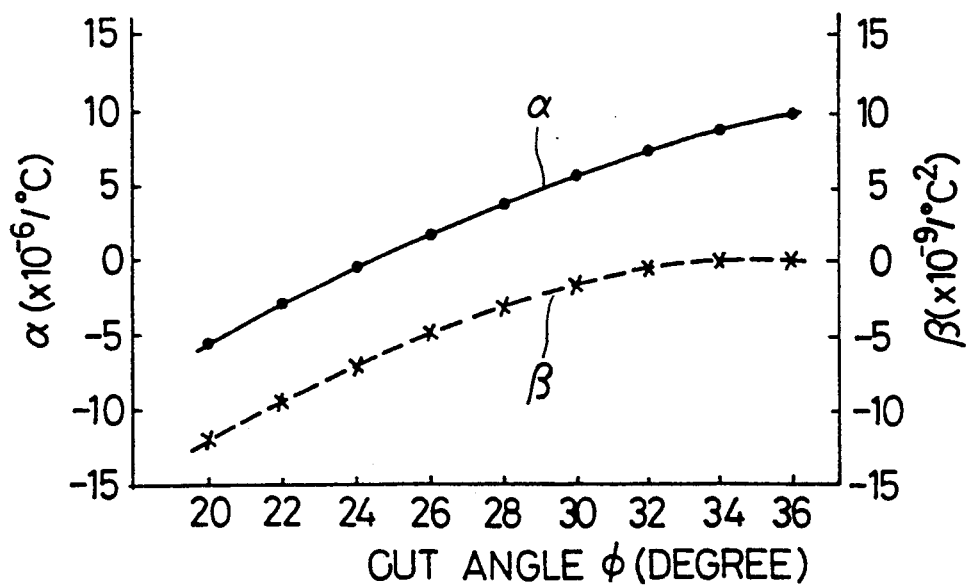
FIG. 2 is a graph showing the relation between the cut angle $\phi$, and the first and second order temperature coefficients $\alpha$, $\beta$ in the inventive width-extensional mode quartz crystal resonator.

FIG. 2 shows the relation between the cut angle $\phi$, and the first order temperature coefficient $\alpha$ and second order temperature coefficient $\beta$ when the inventive width-extensional mode quartz crystal resonator has a thickness $z_0$ much smaller than the width $x_0$, and a length $y_0$ much greater than the width $x_0$. As the cut angle $\phi$ increases from zero degree, the first order temperature coefficient rises such that $\alpha=0$ is set at $\phi=24.6°$. Thus, there is obtained the width-extensional mode quartz crystal resonator having the zero temperature coefficient around the room temperature. As the angle increases further, $\alpha$ increases accordingly. By such manner, particularly the first order temperature coefficient $\alpha$ significantly varies dependently on the cut angle $\phi$, hence a turnover temperature point can be set in a desired range of the temperature. On the other hand, the second order temperature coefficient $\beta$ takes the value of $\beta=-1.21\times10^{-8}/°C.^2$, at $\phi=20°$. As the angle $\phi$ increases, the absolute value of $\beta$ decreases such that $\beta=-0.925\times10^{-10}/°C.^2$ is set at $\phi=35°$. Since the absolute value of $\beta$ can be set small while $\alpha=0$, there can be obtained the width-extensional mode quartz crystal resonator having excellent frequency temperature behavior.

Figure 3:
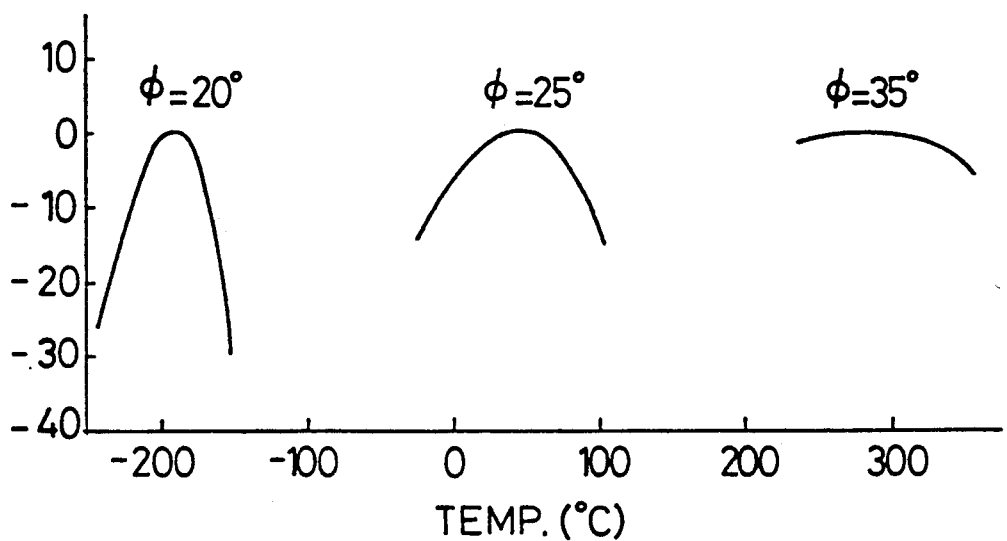
FIG. 3 is a graph showing examples of the frequency temperature behavior curves while different cut angles $\phi$ are set as a parameter in the inventive width-extensional mode quartz crystal resonator.

FIG. 3 shows examples of the frequency-temperature characteristics of the inventive width-extensional mode quartz crystal resonator while different cut angles $\phi$ are set as a parameter. Since $\alpha$ and $\beta$ have negative values at $\phi=20°$, the turnover temperature point Tp is set in the far negative temperature range. However, the condition $\alpha=0$ is approximately held at $\alpha=25°$, hence Tp shifts to the room temperature range. Further, $\alpha$ takes a great positive value at, for example, 35°, hence the turnover temperature point Tp shifts to the high temperature range. In such manner, the turnover temperature point Tp can be set in a desired range by suitably selecting the cut angle $\phi$. For example, the cut angle is set around $\phi=20°$ when excellent frequency temperature behavior is required in the low temperature range for the resonator. On the other hand, the cut angle may be increased to about $\phi=35°$ when resonator is used in the high temperature range. In addition, as mentioned in conjunction with FIG. 2, $\beta$ is set to $-1.21\times10^{-8}/°C.^2$ at $\phi=20°$. The absolute value of $\beta$ decreases further as $\phi$ increases. Accordingly, the width-extensional mode quartz crystal resonator can perform with better frequency temperature behavior when Tp is set in the higher temperature range rather than in the lower temperature range.

Figure 4:
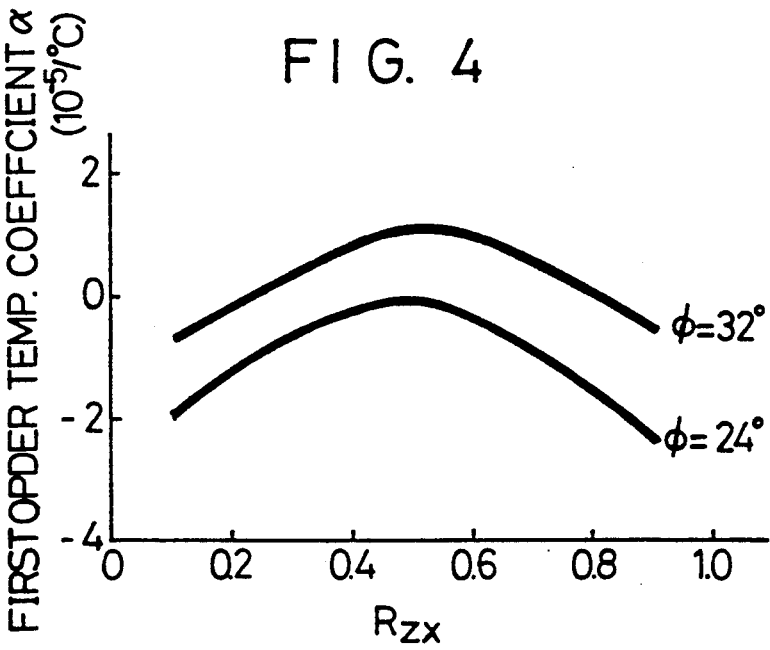
FIG. 4 is a graph showing the relation between the thickness-to-width ratio $R_{zx}$ and the first order temperature coefficient while different cut angles $\phi$ are set as a parameter in the inventive width-extensional mode quartz crystal resonator.

FIG. 4 shows the relation between the thickness-to-width ratio $R_{zx}$ and the first order temperature coefficient while the cut angle $\phi$ is set to different values, e.g., $\phi=24°$ and 32° as a parameter in the inventive width-extensional mode quartz crystal resonator. The frequency temperature behavior has been described in case that the thickness-to-width ratio $R_{zx}$ (thickness $z_0$/width $x_0$) is set very small hereinbefore, whereas the FIG. 4 graph indicates the change of the first order temperature coefficient $\alpha$ while the ratio $R_{zx}$ is gradually increased. As understood from the FIG. 4 graph, the effect of the thickness factor emerges as the thickness-to-width ratio $R_{zx}$ increases, thereby varying the value of $\alpha$. In more detail, the behavior of the width-extensional mode quartz crystal resonator is affected substantially by various subsidiary vibrations dependent on the thickness, including the followings:

(1) thickness shear vibration;
(2) thickness extensional vibration; and
(3) lateral motion dependent on Poission's ratio in the thickness direction Among these three vibration modes, the lateral motion normally affects the value of first order temperature coefficient $\alpha$ without regard to the dimension of the thickness though the degree of the affect may vary. As shown in FIG. 4, as the thickness-to-width ratio $R_{zx}$ increases (the thickness $z_0$ increases while the width $x_0$ is fixed), the thickness shear vibration dependent on the thickness couples to the principal vibration of the width-extensional mode quartz crystal resonator to thereby further shift $\alpha$ to a positive value range. In such case, the thickness extensional vibration does not substantially couple to the principal vibration. However, the coupling to the thickness shear vibration may become weak as the ratio $R_{zx}$ further increases, while coupling to the thickness extensional vibration becomes strong to thereby shift $\alpha$ reversely to the negative value range. This shift manner may be well understood from the experimental data of the FIG. 4 graph. Further, as the cut angle $\phi$ is increased from 24° to 32° while the thickness-to-width ratio $R_{zx}$ is fixed, $\alpha$ is further shifted to a positive value range. The value of the first order temperature coefficient is set to $\alpha=0$ around $R_{zx}=0.25$ and $R_{zx}=0.8$ when $\phi=32°$. When the cut angle $\phi$ is reduced to $\phi=24°$, $\alpha=0$ is set around $R_{zx}=0.5$, thereby realizing a zero temperature coefficient in the width-extensional mode quartz crystal resonator.

Figure 5:
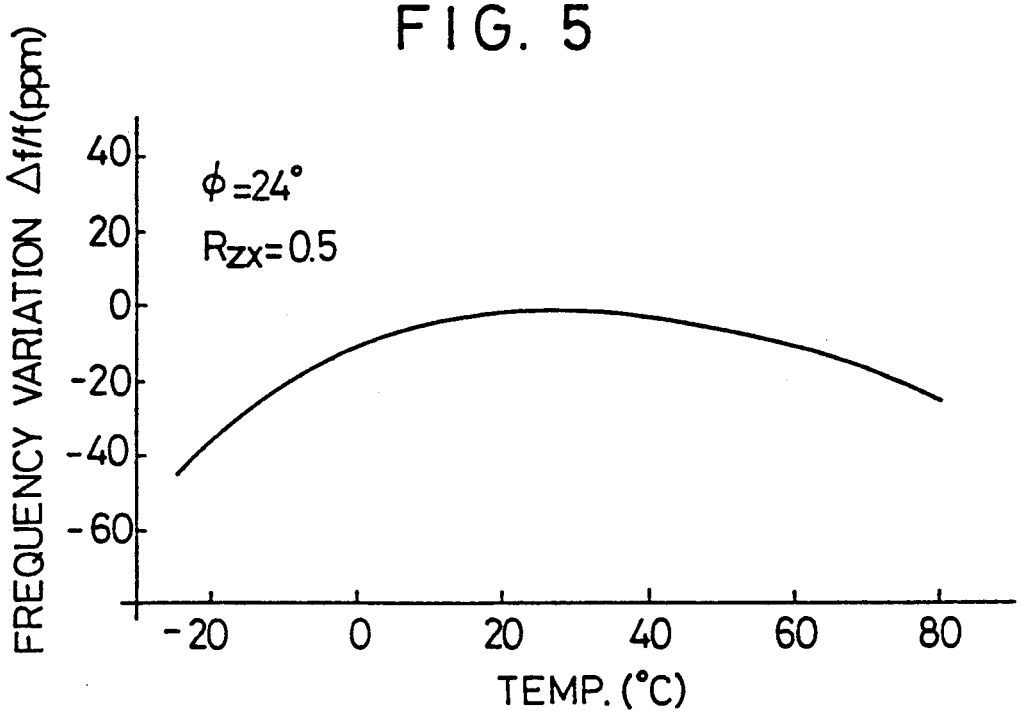
FIG. 5 is a graph showing another example of the frequency temperature behavior of the inventive width-extensional mode quartz crystal resonator.

FIG. 5 shows another example of the frequency temperature behavior of the inventive width-extensional mode quartz crystal resonator. In this example, the resonator is formed such as the cut angle $\phi=24°$, the thickness-to-width ratio $R_{zx}=0.5$ and the resonance frequency f=13.5 MHz. In this configuration, the resonator has the first order temperature coefficient $\alpha=-1.36\times10^{-8}/°C.$ which is quite close to zero, and the second order temperature coefficient $\beta=-1.28\times10^{-8}/°C.^2$ which is smaller than that of the conventional DT cut resonator ($\beta=-1.8\times10^{-8}/°C.^2$), thereby realizing the excellent frequency-temperature characteristics.

Figure 6:
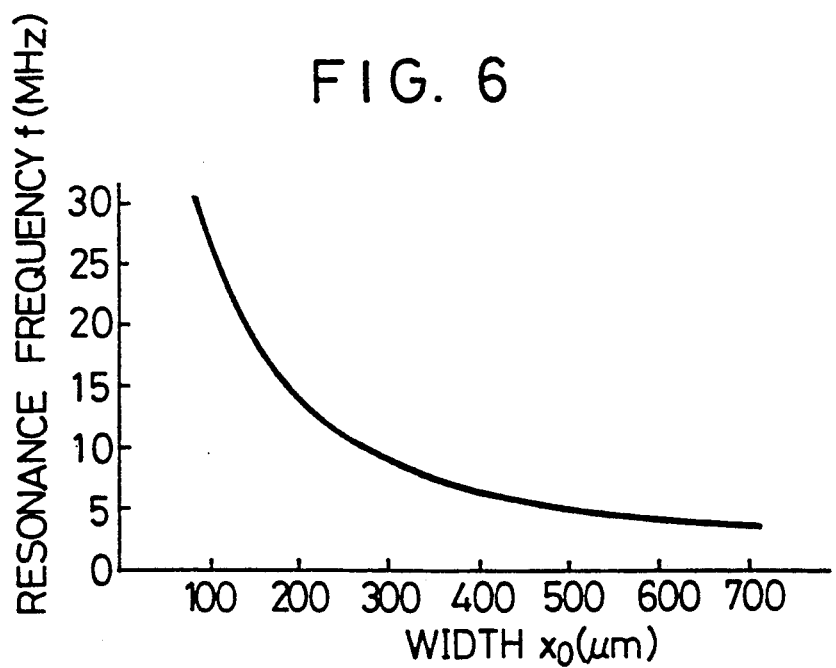
FIG. 6 is a graph showing the relation between the resonator width $x_0$ and the resonance frequency f in the fundamental vibration of the inventive width-extensional mode quartz crystal resonator.

Next, the description is given for the relation between the dimension of width $x_0$ and the resonance frequency of the inventive width-extensional mode quartz crystal resonator. FIG. 6 is a graph showing the relation between the width $x_0$ and the resonance frequency f in the fundamental vibration mode of the inventive width-extensional mode quartz crystal resonator. Although the frequency constant ($f_0 \cdot x_0$) slightly varies in the inventive KT cut width-extensional mode quartz crystal resonator, the frequency constant is held constantly around 270 kHz.cm in the fundamental vibration mode. Therefore, it is recognized that the width $x_0$ should be set less than $x_0 = 675$ μm in order to realize the resonator operative at frequency over f=4.0 MHz. Additionally, there can be obtained higher odd number multiple frequencies, e.g., three, five, seven and so on, times as the fundamental vibration frequency by utilizing the overtone. Further, in order to avoid coupling to the length extensional mode vibration which depends on the length $y_0$, the length $y_0$ should be set far greater than the width $x_0$. Moreover, the ratio $x_0/y_0$ is normally set smaller than 0.1 in order to reduce the series resistance $R_1$. However, when the resonant frequency is set lower than 7 MHz, since the width $x_0$ has a relatively great dimension, the aspect ratio $x_0/y_0$ is set smaller than 0.2 in order to reduce the size of the resonator. Even in such a case, the subsidiary length extensional mode vibration can be prevented from coupling to the main vibration.

Figure 7A:
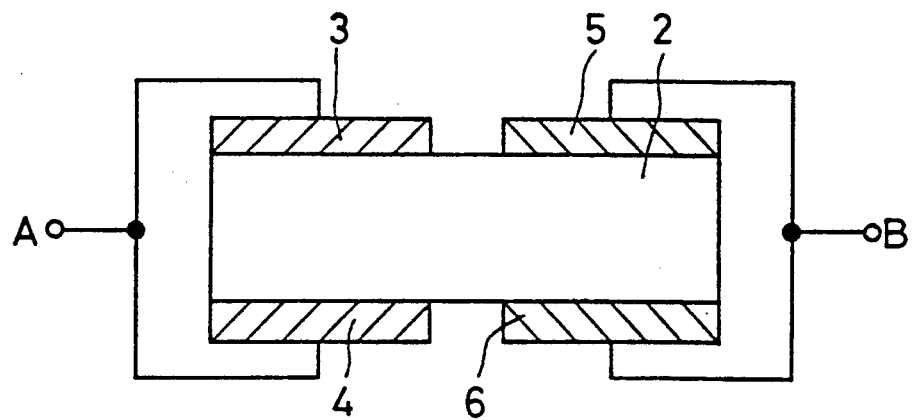
FIGS. 7A, 7B and 7C are sectional views of different excitation electrode structures effective to induce fundamental vibration in the inventive KT cut width-extensional mode quartz crystal resonator.
Figure 7B:
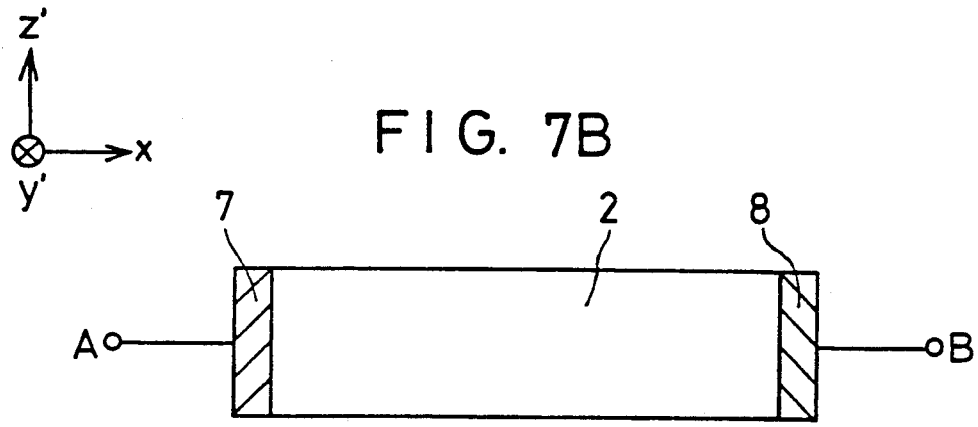
Figure 7C:
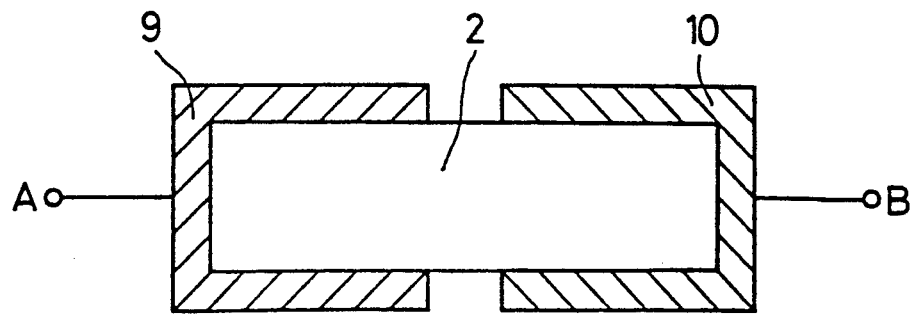

The description has been given hereinabove for the relation between the frequency-temperature characteristics and the resonant frequency. Hereinafter, the description will be given for the electrode construction for exciting the inventive width-extensional mode quartz crystal resonator. FIGS. 7A, 7B and 7C show sectional views of different excitation electrode constructions of the inventive KT cut width-extensional mode resonator. Referring to FIG. 7A, one opposed pair of exciting electrodes 3, 4 and another opposed pair of exciting electrodes 5, 6 are disposed on opposed faces of the width-extensional resonator 2, which are orthogonal to the z' axis. Further, respective ones of the opposed pairs 3, 4 and 5, 6 are connected in the same polarity to provide a pair of electrode terminals A and B.

Referring to FIG. 7B, a pair of exciting electrodes 7, 8 are disposed respectively on opposite end faces of the width-extensional resonator 2. Each end face is formed by etching process and therefore called etched face, and is perpendicular to the x axis. In manner similar to the FIG. 7A construction, the pair of electrodes 7, 8 are formed to constitute the electrode terminal A, B.

Further, referring to FIG. 7C, a pair of exciting electrodes 9, 10 are disposed continuously on separate etched faces of the resonator 2, which are perpendicular to the z' axis and the x axis, thereby forming the pair of electrode terminals A, B in similar manner.

In these constructions of FIGS. 7A, 7B and 7C, an alternating voltage is applied across the pair of electrode terminals A and B to generate an electric field in the x direction. By such operation, the width-extensional mode quartz crystal resonator is excited efficiently to undergo a significant vibration in the widthwise direction of $x_0$. Consequently, the series resistance $R_1$ can be considerably reduced in the width-extensional mode resonator. In addition, the dimension of the exciting electrodes 3-10 formed in the FIGS. 7A, 7B and 7C constructions is determined taking into account spurious vibrations and electrical field efficiency. Particularly, the dimension of the electrode along the y' axis direction may be set to cover the entire length $y_0$ of the resonator piece so as to most effectively reduce the series resistance $R_1$.

Figure 8:
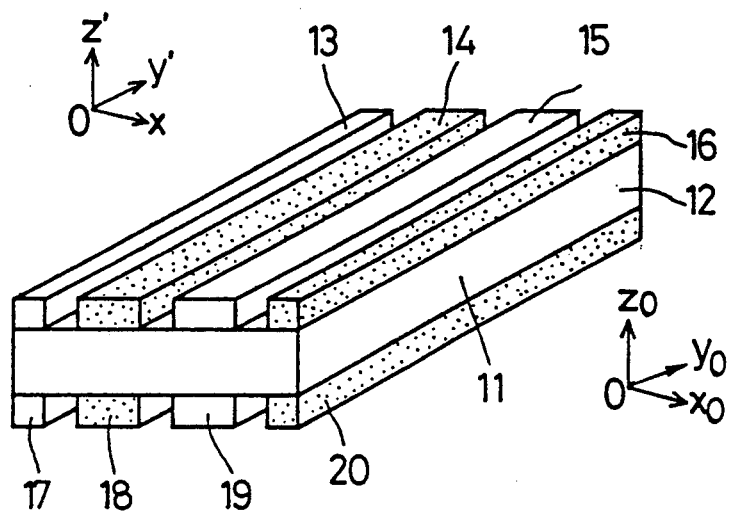
FIG. 8 is an overall view of the excitation electrode structure effective to induce the third order overtone in the inventive KT cut width-extensional mode quartz crystal resonator.

FIG. 8 shows an overall view of an exciting electrode structure designed to induce the third order overtone in the inventive KT cut width-extensional mod quartz crystal resonator. The resonator 11 has the length $y_0$, width $x_0$ and thickness $z_0$, dimensioned to satisfy the relation $y_0 > > x_0 > z_0$. The resonator is formed by an etching process to leave each etched face 12. However, behind faces in the widthwise and lengthwise directions are hidden from the view. A plurality of exciting electrodes 13, 14, 15, 16, 17, 18, 19 and 20 are formed on opposed faces which are orthogonal to the etched face 12. One group of the exciting electrodes 13, 15, 17 and 19 are formed to receive the same polarity of a drive voltage, and another group of the exciting electrodes 14, 16, 18 and 20 are formed also to receive the same polarity of a drive voltage. The two groups of the electrodes are arranged to receive different polarities of the drive voltage, respectively. Accordingly, an alternating drive voltage is applied across the two groups of the exciting electrodes so as to induce the width-extensional mode vibration. In this embodiment, a piece of the width-extensional mode quartz crystal resonator 11 is cut from a Z' plate which is defined by rotating the Z plate around the x axis by an angle $\phi$ set in the range of 20°–35°. Consequently, the zero temperature coefficient is realized in the width-extensional mode resonator as described before.

Figure 9:
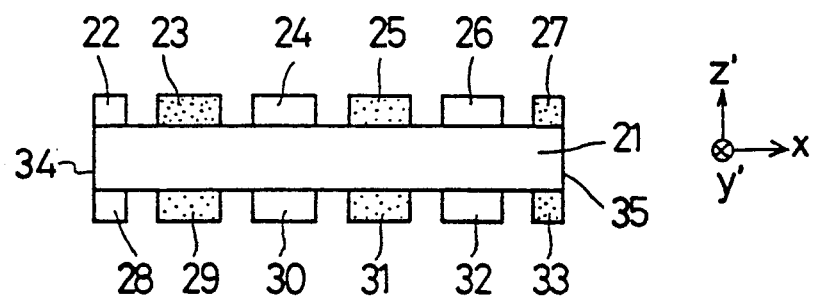
FIG. 9 is a sectional view of the excitation electrode structure effective to induce the fifth order overtone in the inventive KT cut width-extensional mode quartz crystal resonator.

FIG. 9 shows a sectional view showing an exciting electrode construction of the inventive KT cut width-extensional mode quartz crystal resonator. Exciting electrodes 22–33 are arranged on opposed faces of the width-extensional mode quartz crystal resonator piece 21, which are perpendicular to etched faces 34, 35 of the resonator piece 21. The even number of exciting electrodes 22–32 and the odd number of exciting electrodes 23–33 are arranged to receive the opposite polarities of the drive voltage to thereby induce the fifth order overtone in the width-extensional mode quartz crystal resonator.

Figure 10:
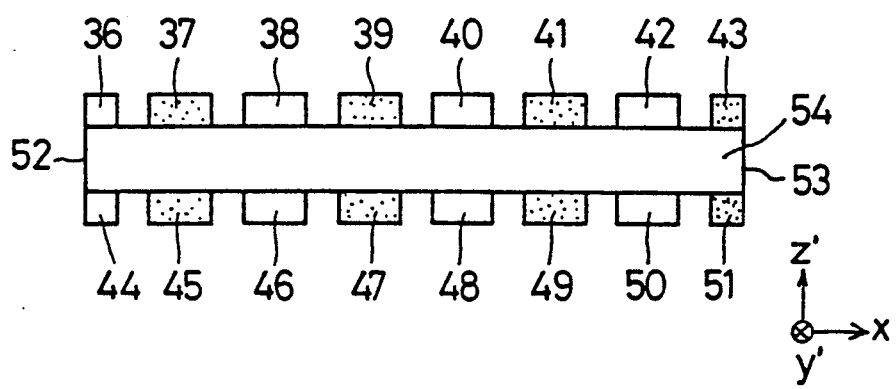
FIG. 10 is another sectional view of the excitation electrode structure effective to induce the seventh order overtone in the inventive KT cut width-extensional mode quartz crystal resonator.

FIG. 10 is another sectional view showing a different exciting electrode construction of the inventive KT cut width-extensional mode quartz crystal resonator. There are formed on opposed faces perpendicular to etched faces 52, 53 of the resonator piece 54 one group of exciting electrodes 36, 38, 40, 42, 44, 46, 48 and 50 of one polarity and another group of exciting electrodes 37, 39, 41, 43, 45, 47, 49 and 51 of another polarity. By such configuration, the seventh order overtone can be induced in the resonator piece.

As readily understood from the FIGS. 8, 9 and 10 cases, a higher order overtone can be induced selectively according to a number of arranged exciting electrode segments. Generally in order to induce an n-th order overtone, there are arranged (n+1) number of exciting electrode segments on respective ones of opposed faces which are perpendicular to etched edge faces of the resonator piece such that each pair of the exciting electrodes opposed to on another in the widthwise direction $z_0$ are of the same polarity and an adjacent pair of the exciting electrodes in the widthwise direction are of the opposite polarities with one another. Consequently in the present invention, the width-extensional mode quartz crystal resonator features the resonant frequency over ten and several MHz, small series resistance $R_1$ and high Q value.

Figure 11:
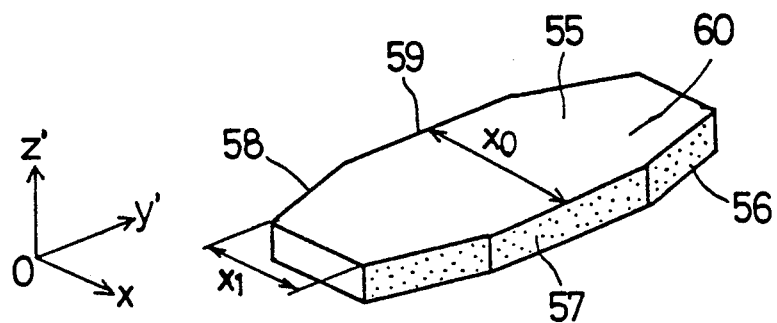
FIG. 11 shows an overall view of the inventive width-extensional mode quartz crystal resonator and its coordinate system.

FIG. 11 is an overall view of a piece of the inventive width-extensional mode quartz crystal resonator and its coordinate system O-x'y'z'. A resonator piece 55 has a pair of side faces 56, 58 in the bevel shape. Namely, a vibrating portion 60 has a central width $x_0$ and an end width $x_1$ such as to satisfy the relation $x_0 > x_1$ by the bevel shaping. The resonator piece 55 is formed typically by chemical etching process. Therefore, the side faces 56, 58 are called an etched face. Alternatively, the resonator piece may be shaped by mechanical processing. A central portion of each etched face is formed perpendicular to the electrical axis x of the quartz crystal lattice. Therefore, a pair of exciting electrodes 57 and 59 (the latter is hidden from view) are arranged at least on the vicinity of the intermediate portion of the respective etched faces. These exciting electrodes 57, 59 lead to either of the major faces of the vibrating portion 60 for electrical connection to external terminals. Further, as mentioned before, the y' axis and z' axis are, respectively, new mechanical axis and optical axis defined after rotating the original Z plate around the x axis by an angle $\phi$ in the range of 20°–35°.

Figure 12:
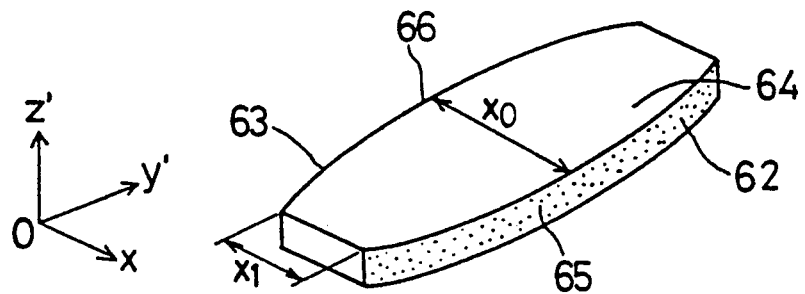
FIG. 12 shows another overall view of a different shape of the inventive width-extensional mode quartz crystal resonator and its coordinate system.

FIG. 12 shows an overall view of another shape of the inventive width-extensional mode quartz crystal resonator piece and its coordinate system. The resonator piece 61 has a pair of side faces 62, 63 formed in a convex shape. Namely, a vibrating portion 64 has a central width $x_0$ and an end width $x_1$ designed to satisfy the relation $x_0 > x_1$ to form the convex outer shape. Further, as mentioned in conjunction with FIG. 11, the side faces 62, 63 are called an etched face. These etched faces are provided with an exciting electrode 65 and another exciting electrode 66 hidden from view. These exciting electrodes 65, 66 are lead to either of the opposed major faces of the vibrating portion 64 for electrical connection to external terminals. In the FIG. 12 construction, as well as in the FIG. 11 construction, the exciting electrodes 57, 59, 65 and 66 are formed on the entire area of the side faces of the vibrating portion; however, these electrodes may be formed on a part of the etched faces, or a part of the exciting electrodes may be extended over a part of the major face perpendicular to the thickness direction, i.e., the z' axis direction to thereby ensure sufficient electrical characteristics.

Figure 13:
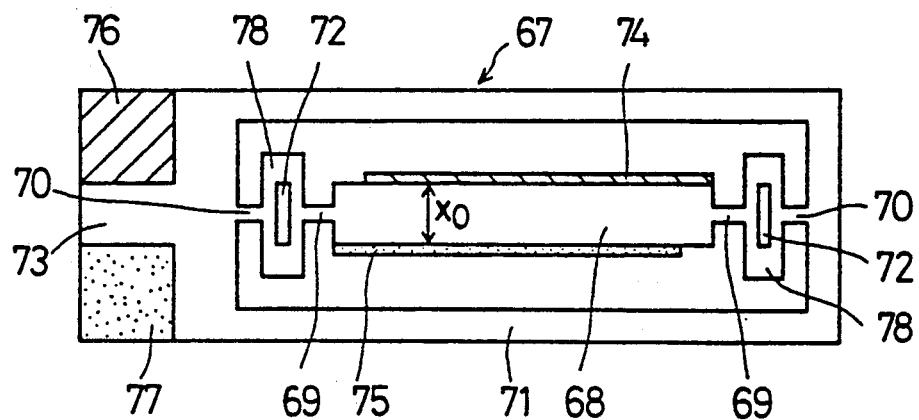
FIG. 13 is a plan view showing a shape and an excitation electrode configuration of the inventive width-extensional mode quartz crystal resonator.

FIG. 13 is a plan view showing an overall configuration of the inventive width-extensional mode quartz crystal resonator together with its exciting electrodes. The width-extensional mode quartz crystal resonator 67 is comprised of a vibrational portion 68, a pair of support portions 78, a frame portion 71 and a mount portion 73. These portions are formed integrally by the etching method. In detail of the structure, the vibrational portion 68 is connected to the pair of support portions 78 through corresponding bridge portions 69. The support portions 78 are disposed at lengthwise opposite ends of the vibrational portion 68. Further, each support portion 78 is formed with an opening 72. Another bridge portion 70 is disposed in opposite relation to the bridge portion 69 with respect to the opening 72. One of the support portions 78 is connected to the frame portion 71, and the other of the support portions 78 is connected to the mount portion 73. Further, the frame portion 71 is extended to the mount portion 73.

A pair of exciting electrodes 74, 75 are arranged in opposite polarity relation to each other on opposed faces of the vibrational portion 68, which are parallel to the lengthwise direction and perpendicular to the widthwise direction. The one exciting electrode 74 is electrically connected through the support portion 78 to a terminal electrode 76. In the same manner, the other exciting electrode 75 is led through the support portion to another terminal electrode 77. In such manner, two-terminal electrode structure is formed on the mount portion 73. The respective support portions 78 are formed with separate electrodes of opposite polarities. The exciting electrodes 74, 75 are formed after shaping the segments of the widthwise-extensional mode quartz crystal resonator. Though the exciting electrodes 74, 75 are formed on a part of the vibrational portion 68 in the FIG. 13 embodiment, exciting electrodes may be formed on the entire area of the etched faces of the vibrational portion 68.

Figure 14:
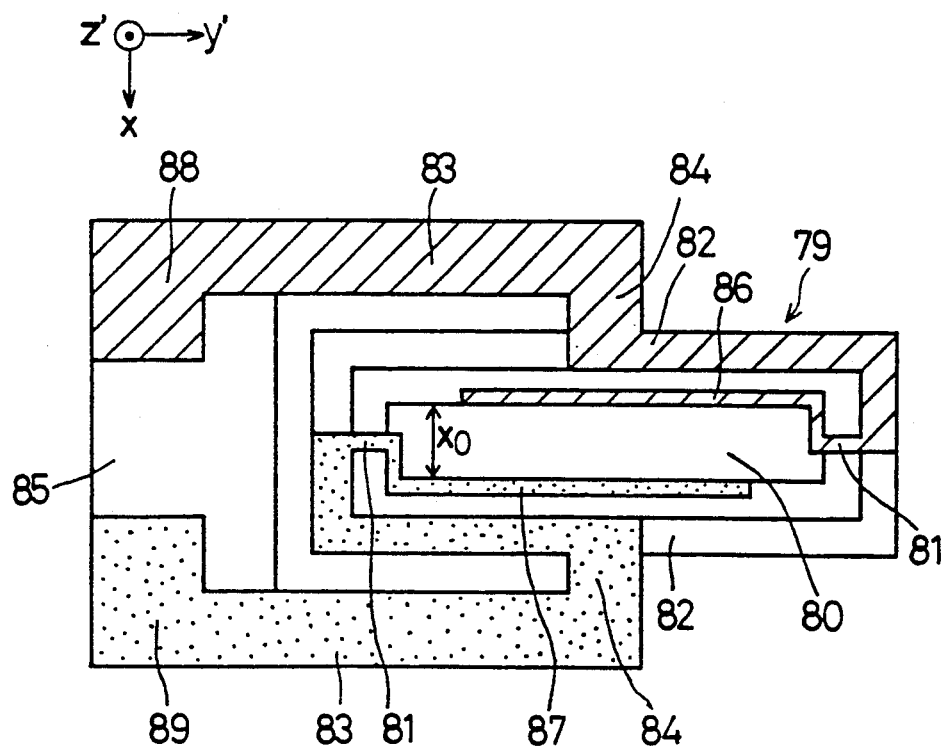
FIG. 14 is another plan view showing a shape and an excitation electrode configuration of the inventive width-extensional mode quartz crystal resonator.

FIG. 14 is a plan view showing another configuration of the inventive width-extensional mode quartz crystal resonator and its exciting electrode arrangement. The width-extensional mode quartz crystal resonator 79 is comprised of a vibrational portion 80, a first frame 82, a second frame 83, a mount portion 85, and bridge portions 81, 84 which constitute a support. These segments are formed integrally by the etching method. In detail of the construction, the vibrational portion 80 is connected at its lengthwise opposite ends to the first frame 82 through the pair of bridge portions 81 which extend from respective widthwise sides of the first frame 92. Further, the first frame 82 is connected at a central portion of respective lengthwise sides of the first frame 82 to the second frame 83 through the other pair of bridge portions 84. The second frame 83 is extended to the mount portion 85. In this construction, the first frame 82 is formed to surround the vibrational portion 80. A pair of exciting electrodes 86, 87 are arranged in opposite polarity relation to each other on widthwise opposed faces of the vibrational portion 80, which are parallel to the lengthwise direction. The one exciting electrode 86 is led to a terminal electrode 88 arranged on the mount portion 85, through the path of the bridge portion 81, the first frame 82, the bridge portion 84 and the second frame 83. In similar manner, the other exciting electrode 87 is led to another terminal electrode 89 formed on the mount portion 85, through the other path of the bridge portion 81, the first frame 82, the second bridge portion 84 and the other branch of the second frame 83. By such arrangement, two-terminal electrode construction is formed on the mount portion 85, thereby reducing the size of the width-extensional mode quartz crystal resonator.

I claim:

1. A width-extensional mode quartz crystal resonator comprising: a quartz crystal piece capable of undergoing a width-extensional mode vibration and formed from a quartz crystal plate cut along a plane defined by rotating a Z plane perpendicular to a z axis representative of an optical axis of quartz crystal around an x axis representative of an electrical axis of quartz crystal by a given rotation angle in the range of 23°–28°, wherein the quartz crystal piece has a thickness $z_0$ and a width $x_0$ and a thickness-to-width ratio $R_{zx} = z_0/x_0$ in the range of 0.45–0.65.

2. A width-extensional mode quartz crystal resonator according to claim 1; further comprising exciting electrode means for inducing a width-extensional mode vibration in the quartz crystal piece, the exciting electrode means being arranged on the quartz crystal piece at least along a face perpendicular to a z' axis which is defined by the given rotation angle to induce the width-extensional mode vibration and its overtone.

3. A width-extensional mode quartz crystal resonator according to claim 1; further comprising exciting electrode means for inducing a width-extensional mode vibration in the quartz crystal piece, the exciting electrode means being arranged on the quartz crystal piece along an etched face of the quartz crystal piece to induce the width-extensional mode vibration and its overtone.

4. A width-extensional mode quartz crystal resonator according to claim 1; further comprising a plurality of exciting electrode segments arranged on the crystal quartz piece along a face perpendicular to a z' axis which is defined by rotating the z axis around the x axis by the given rotation angle to induce the width-extensional mode vibration and its overtone.

5. A width-extensional mode quartz crystal resonator comprising: a vibrational potion capable of undergoing a width-extensional mode vibration and being connected to a first frame portion formed integrally by an etching process for supporting the vibrational portion such as to surround the vibrational portion through respective bridge portions arranged at lengthwise opposite ends of the vibrational portion, the first frame portion being connected to a second frame portion through respective ones of the bridge portions arranged near the central portion of the first frame portion, the second frame portion being extended to a mount portion, the vibration portion having a thickness-to-width ratio $R_{zx}$ in the range of 0.45 through 0.65, and the resonator having a cut angle $\phi$ in the range of 23° through 28°; and excitation electrodes arranged on both top and bottom surfaces of the vibrational portion and perpendicular to the x-axis, the excitation electrodes extending to the mount portion via a respective bridge portion, and each excitation electrode forming a respective terminal electrode.

6. A width-extensional mode quartz crystal resonator, comprising: a quartz crystal piece capable of undergoing a width-extensional mode vibration and having a thickness dimension and a width dimension and a thickness-to-width ratio between 0.45 and 0.65, the quartz crystal piece being formed from a quartz crystal plate cut along a plane defined by rotation a Z plane perpendicular to an optical axis of the quartz crystal around an electrical axis thereof by a rotation angle between 23°–28°.

7. A width-extensional mode quartz crystal resonator according to claim 6; further comprising exciting electrode means on the quartz crystal piece for inducing a width-extensional mode vibration in the quartz crystal piece.

8. A width-extensional mode quartz crystal resonator according to claim 7; wherein the exciting electrode means is arranged on the quartz crystal piece so as to induce the width-extensional mode vibration and an overtone of the width-extensional mode vibration.

9. A width-extensional mode quartz crystal resonator according to claim 7; wherein the exciting electrode means is arranged on the quartz crystal piece along at least one of a face perpendicular to an axis defined by the given rotation angle and an etched face of the quartz crystal piece so as to induce the width-extensional mode vibration and an overtone of the width-extensional mode vibration.

10. A width-extensional mode quartz crystal resonator according to claim 7; wherein the exciting electrode means comprises a plurality of exciting electrode segments arranged on the crystal quartz piece along a face perpendicular to a z' axis which is defined by rotating the z axis around the x axis by the given rotation angle to induce the width-extensional mode vibration and an overtone of the width-extensional mode.

11. A width-extensional mode quartz crystal resonator, comprising: a width-extensional mode vibrational portion; a first frame portion having a pair of lengthwise sides and a pair of widthwise sides surrounding the vibrational portion for supporting the vibrational portion; a pair of first bridge portions each extending from a respective widthwise side of the first frame portion and supporting a respective lengthwise side of the vibrational portion; a second frame portion for supporting the first frame portion; and a pair of second bridge portions each extending from the second frame portion and supporting a respective lengthwise side of the first frame portion, the vibrational portion having a thickness-to-width ratio $R_{zx}$ in the range of 0.45 through 0.65 and the resonator having a cut angle $\phi$ in the range of 23° through 28°; and a pair of exciting electrodes each arranged on respective opposite faces of the vibrational portion perpendicular to a widthwise direction of the vibrational portion so as to induce a width-extensional mode vibration and an overtone of the width-extensional mode vibration, the excitation electrodes each forming a respective terminal electrode.

12. A width-extensional mode quartz crystal resonator according to claim 11; wherein each of the pair of second bridge portions supports the respective lengthwise side of the first frame portion at a central portion thereof.

* * * * *